United States Patent
Kim

(10) Patent No.: US 6,781,574 B1
(45) Date of Patent: Aug. 24, 2004

(54) APPARATUS AND METHOD FOR PREVENTING POOR OPERATION OF KEY DUE TO CHATTERING NOISE

(75) Inventor: Kook-Won Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/084,589

(22) Filed: May 27, 1998

(30) Foreign Application Priority Data

May 27, 1997 (KR) .............................................. 97-20949

(51) Int. Cl.[7] .............................. G09G 5/00; H04B 3/36; H03K 17/94
(52) U.S. Cl. ...................... 345/168; 341/24; 340/407.2; 235/145 R
(58) Field of Search ................................ 345/168, 160, 345/170, 172; 340/365, 825.56, 825.62, 407.2; 341/26, 22–25

(56) References Cited

U.S. PATENT DOCUMENTS

| | | | | |
|---|---|---|---|---|
| 4,412,218 A | * | 10/1983 | Niitsu .................... | 340/825.56 |
| 4,704,601 A | * | 11/1987 | Engstrom .................... | 340/365 |
| 4,914,428 A | * | 4/1990 | Kobayashi et al. .... | 340/825.62 |
| 5,059,975 A | * | 10/1991 | Nakatsuka .................... | 341/26 |
| 5,081,453 A | * | 1/1992 | Endoh et al. .................. | 341/22 |
| 5,635,958 A | * | 6/1997 | Murai et al. ................ | 345/168 |

* cited by examiner

Primary Examiner—Bipin Shalwala
Assistant Examiner—David L Lewis
(74) Attorney, Agent, or Firm—Robert E. Bushnell, Esq.

(57) ABSTRACT

An apparatus and method for preventing poor operation of a key due to chattering noise are provided. The apparatus includes a control button section for generating a key signal to control a display monitor, and a microcomputer which contains a control program for preventing poor operation of a key due to chattering noise in the key signal generated by the control button section. The microcomputer detects the key signal when the chattering noise is generated, determines whether the key signal is in a normal state or not, and processes the key signal. When the chattering noise is generated in a tactile switch of the control button section of the display monitor, the AD port of the microcomputer detects it, and determines whether or not the key operates normally, thereby preventing poor operation of the key due to the chattering noise.

20 Claims, 4 Drawing Sheets

APPARATUS AND METHOD FOR PREVENTING POOR OPERATION OF KEY DUE TO CHATTERING NOISE

This application makes reference to, incorporates the same herein, and claims all benefits accruing under 35 U.S.C. §119 from my applications entitled APPARATUS AND METHOD FOR PREVENTING POOR OPERATION OF KEY DUE TO CHATTERING NOISE filed in the Korean Industrial Property Office on 27$^{th}$ of May 1997 and there duly assigned Serial No. P97-20949 by that Office.

BACKGROUND OF THE INVENTION

1. Technical Field

The present invention relates to an apparatus and method for preventing poor operation of a key due to chattering noise, and specifically, to an apparatus and method for preventing poor operation of a key due to chattering noise. In that regard, "chattering noise" is the repeated opening and closing of contact points of tactile switches of a control button section attached to a display monitor because of external causes.

2. Related Art

Electric and electronic products generally employ microcomputers to control their additional devices. The microcomputer is also used to control a display monitor of a computer and each of its circuit blocks.

In particular, the microcomputer with a display monitor receives horizontal and vertical synchronous signals from the computer associated with the display monitor, and drives corresponding horizontal and vertical deflection circuits, as well as a high voltage circuit, to generate the necessary voltages for control of the display on a cathode ray tube (CRT) contained within the display monitor.

In addition, the display monitor typically includes a control button section containing switches for controlling (for example) horizontal position, vertical position, horizontal size, etc., of the image displayed on the CRT of the display monitor. Moreover, such a control button section often employs tactile switches which employ a contact point method. A problem arises in that, when a user employs the tactile switches, they can generate a chattering noise representing instability of the contact point due to physical and electrical causes externally created. This presents a problem to the operation of the display monitor, and therefore there is a need for the development of an apparatus and method for preventing poor operation of a key resulting from poor operation of a tactile switch of a control button section of a display monitor due to chattering noise generated in the tactile switch.

SUMMARY OF THE INVENTION

An object of the present invention is to provide an apparatus and method for preventing poor operation of a key due to poor operation of a tactile switch of a control button section of a display monitor as a result of chattering noise generated in the tactile switch.

To accomplish the object of the present invention, there is provided an apparatus for preventing poor operation of a key due to chattering noise, including: a control button section for generating a key signal to control a display monitor; and a microcomputer which contains a control program for preventing poor operation of a key due to chattering noise in the key signal generated by the control button section, by detecting the key signal when the chattering noise is generated, determining if the key signal is in a normal state or not, and processing the key signal.

A method of preventing poor operation of a key due to chattering noise according to the present invention includes the steps of: (a) detecting a key input voltage with an AD port of a microcomputer; (b) determining whether the key input voltage detected in step (a) is within the limits of a minimum and maximum voltage required for an effective key; (c) setting a key flag when it is determined that the key input voltage is within the limit required for an effective key; (d) resetting the key flag when it if determined that the key input voltage is not within the limit required for an effective key; (e) confirming the key flag setting from steps (c) and (d); (f) executing a key input according to a key execution voltage when step (e) confirms that the key flag is set; and (g) ignoring the key input when step (e) confirms that the key flag is not set.

BRIEF DESCRIPTION OF THE ATTACHED DRAWINGS

A more complete appreciation of the invention, and many of the attendant advantages thereof, will be readily apparent as the same becomes better understood by reference to the following detailed description when considered in conjunction with the accompanying drawings in which like reference symbols represent the same or similar components, wherein.

DETAILED DESCRIPTION OF PREFERRED EMBODIMENT

Figure 1:
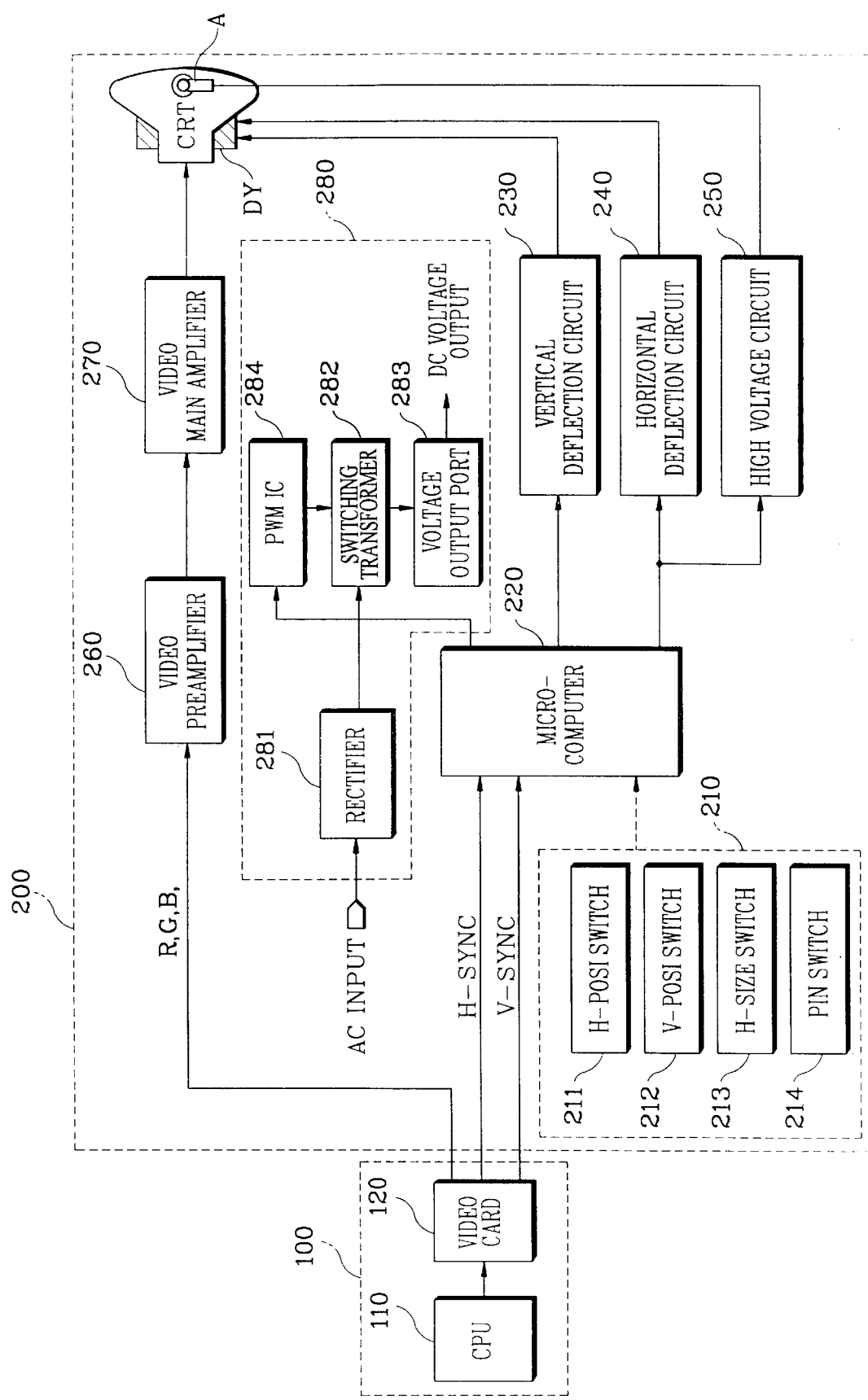
FIG. 1 is a block diagram showing a configuration of the inner circuit of a display monitor.

FIG. 1 is a block diagram showing a configuration of the inner circuit of a display monitor. Referring to FIG. 1, a computer 100 includes a CPU 110 for receiving and processing a key signal generated by a user, and for generating data depending on the processed result, and a video card 120 for receiving the data from CPU 110, for processing it to obtain a video signal (R,G,B), and for generating a horizontal synchronous signal H-SYNC and a vertical synchronous signal V-SYNC for synchronizing the video signal (R,G,B).

A display monitor 200, which receives the video signal (R,G,B) from video card 120 of computer 100 and processes it to display it as an image, includes: a control button section 210 for generating switch signals for controlling images displayed on display monitor 200; a microcomputer 220 for receiving horizontal and vertical synchronous signals H-SYNC and V-SYNC, respectively, from video card 120 and switch signals from control button section 210, and for processing them to determine the resolution and frequency of the video signal (R,G,B) and to generate a vertical oscillation pulse and a horizontal oscillation pulse; a vertical deflection circuit 230 for receiving the vertical oscillation pulse from microcomputer 220 so as to generate a vertical sawtooth wave current which is provided to a deflection yoke DY; a horizontal deflection circuit 240 for receiving the horizontal oscillation pulse from microcomputer 220 so as to generate a horizontal sawtooth wave current which is provided to the deflection yoke DY; a high voltage circuit 250 for providing a high voltage to the anode (A) of a cathode ray tube (CRT) 290 according to the cycle of the horizontal oscillation pulse generated by microcomputer 220; a video pre-amplifier 260 for receiving the video signal (R,G,B) from video card 120 of computer 100 and amplifying it to a predetermined level; a video main amplifier 270 for sufficiently amplifying the video signal (R,G,B) amplified by video pre-amplifier 260 to a predetermined level so as to display it on the CRT 290 according to the cycle of the horizontal sawtooth wave current and vertical sawtooth wave current generated by the deflection yoke DY; and a power circuit 280 for supplying DC voltage required for operating each circuit block of the display monitor 200.

The operation of each circuit block of display monitor 200 with the above configuration is described below in detail. Horizontal and vertical synchronous signals H-SYNC and V-SYNC, respectively, generated by video card 120 of computer 100 are applied to microcomputer 220 which stores data for controlling the display monitor picture. Microcomputer 220 also receives a switch signal generated when control button section 210 is used. Control button section 210 includes a horizontal position (H-POSI) switch 211 for controlling the horizontal position on display monitor 200, a vertical position (V-POSI) switch 212 for controlling the vertical position, a horizontal size (H-SIZE) switch 213 for controlling the horizontal size, and a pin switch 214 for controlling a distortion-in-pin phenomenon which is generated in display monitor 200. Control button section 210 may includes more switches as needed.

When the switch signal is generated by control button section 210, microcomputer 220 receives the switch signal and the horizontal and vertical synchronous signals H-SYNC and V-SYNC, respectively. Microcomputer 220 then reads picture control data previously stored according to the applied signals, and corrects it, generating the horizontal and vertical oscillation pulses. Vertical deflection circuit 230 receives the vertical oscillation pulse from microcomputer 220 so as to provide the vertical sawtooth wave current corresponding to vertical synchronous signal V-SYNC to deflection yoke DY, thereby determining a vertical scanning cycle. Horizontal deflection circuit 240 receives the horizontal oscillation pulse from microcomputer 220, so as to generate the horizontal sawtooth wave current corresponding to horizontal synchronous signal V-SYNC to deflection yoke DY, thereby determining a horizontal scanning cycle.

The CRT 290, which displays an image according to the cycles of the horizontal sawtooth wave current and vertical sawtooth wave current generated by deflection yoke DY, receives the video signal (R,G,B) output from video card 120 as amplified by video pre-amplifier 260 and video main amplifier 270, and scans it according to the cycles of the horizontal sawtooth wave current and vertical sawtooth wave current which flow through deflection yoke DY, thereby displaying the image. The anode (A) attached on one side of the CRT 290 receives high voltage multiplied by high voltage circuit 250 depending on the cycle of the horizontal oscillation pulse output from microcomputer 220, and forms an anode field inside the CRT 290 according to the applied high voltage so as to control the luminance of the image.

Power circuit 280, which supplies DC voltage required for each circuit block of display monitor 200, receives alternating current (AC) and rectified it in a rectifier 281 to form a direct current (DC) voltage required at the secondary side of a switching transformer 282 and outputs it through a voltage output port 283. Control button section 210 for controlling the display monitor 200 has a tactile switch using a contact point method. However, this generates a chattering noise representing instability of the contact point due to physical and electrical causes externally created.

Figure 2:
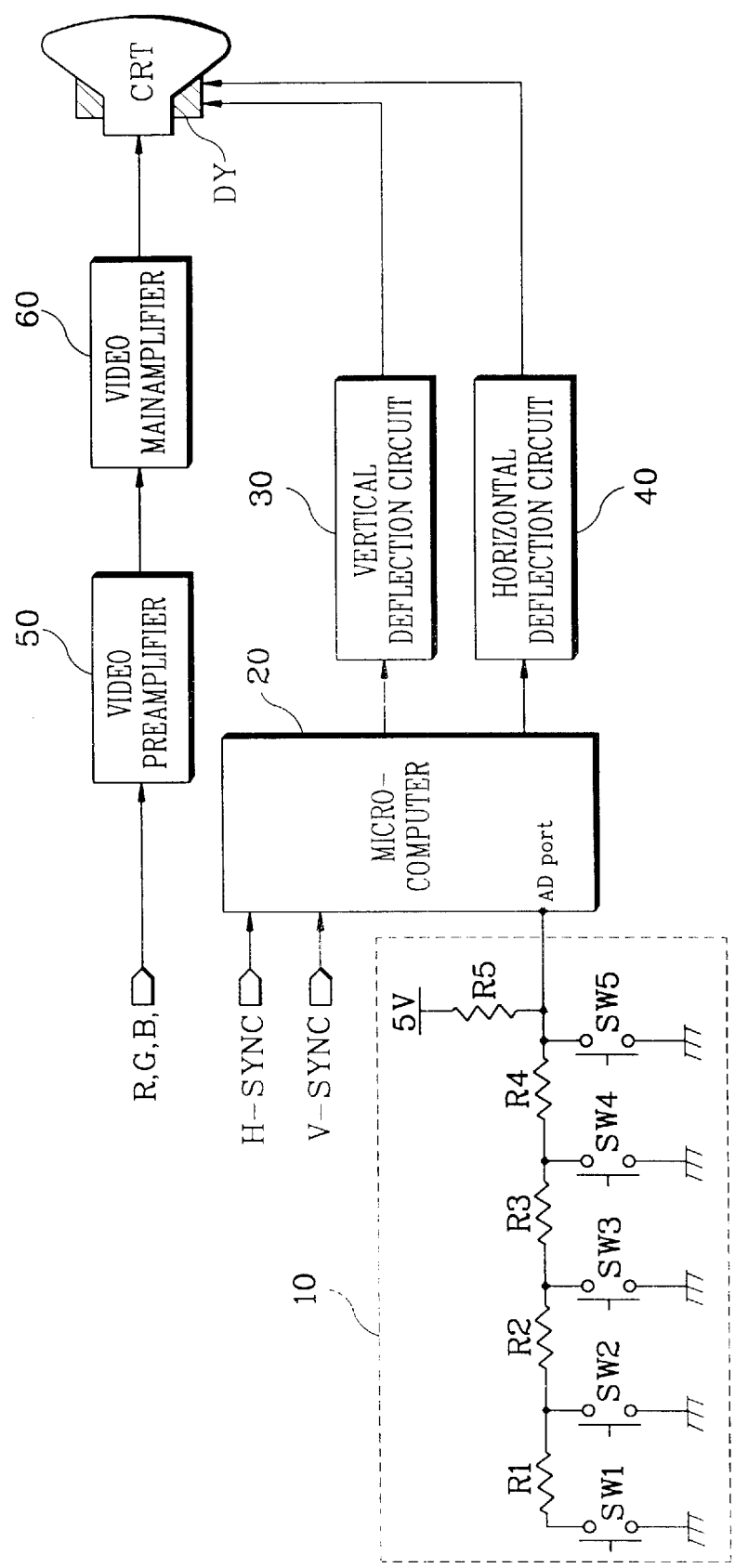
FIG. 2 is a block diagram showing a configuration of the inner circuit of a display monitor including an apparatus for preventing poor operation of a key according to the present invention.

FIG. 2 is a block diagram showing a configuration of the inner circuit of a display monitor including an apparatus for preventing poor operation of a key according to the present invention. Referring to FIG. 2, the display monitor includes: a control button section 10 for generating key signals for controlling the picture of the display monitor or its function; a microcomputer 20 for receiving a horizontal synchronous signal H-SYNC and a vertical synchronous signal V-SYNC generated by a computer (shown in FIG. 1) to determine the resolution and frequency mode of a video signal (R,G,B) generated by the computer, the microcomputer 20 containing a control program for preventing poor operation of a key due to chattering noise in a key signal output from control button section 10 by detecting the key signal when the chattering noise is created so as to determine whether or not the key signal is in normal state, and to process it, the microcomputer 20 generating horizontal and vertical oscillation pluses according to the key signal applied thereto; a vertical deflection circuit 30 for receiving the vertical oscillation pulse from microcomputer 20 so as to provide a vertical sawtooth wave current to deflection yoke DY; a horizontal deflection circuit 40 for receiving the horizontal oscillation pulse from microcomputer 20 so as to provide a horizontal sawtooth wave current to deflection yoke DY; a video pre-amplifier 50 for amplifying the video signal (R,G,B) output from the computer to a predetermined level; and a video main amplifier 60 for amplifying the video signal amplified by video pre-amplifier 50 sufficiently to display it on a CRT 70 according to the cycles of the horizontal sawtooth wave current and vertical sawtooth wave current generated by the deflection yoke DY.

Control button section 10 includes a plurality of tactile switches SW1 to SW5 and resistors R1 to R4 which operate by DC voltage (5V) induced through a resistor R5, and which control the function of the display monitor and the image displayed thereon. Microcomputer 20 includes an AD port for detecting the key signal when control button section 10 generates chattering noise. With the aforementioned display monitor for preventing poor operation of a key due to the chattering noise, the algorithm of a control program for preventing poor operation of a key stored in microcomputer 20 is explained below with reference to FIG. 3.

Figure 3:
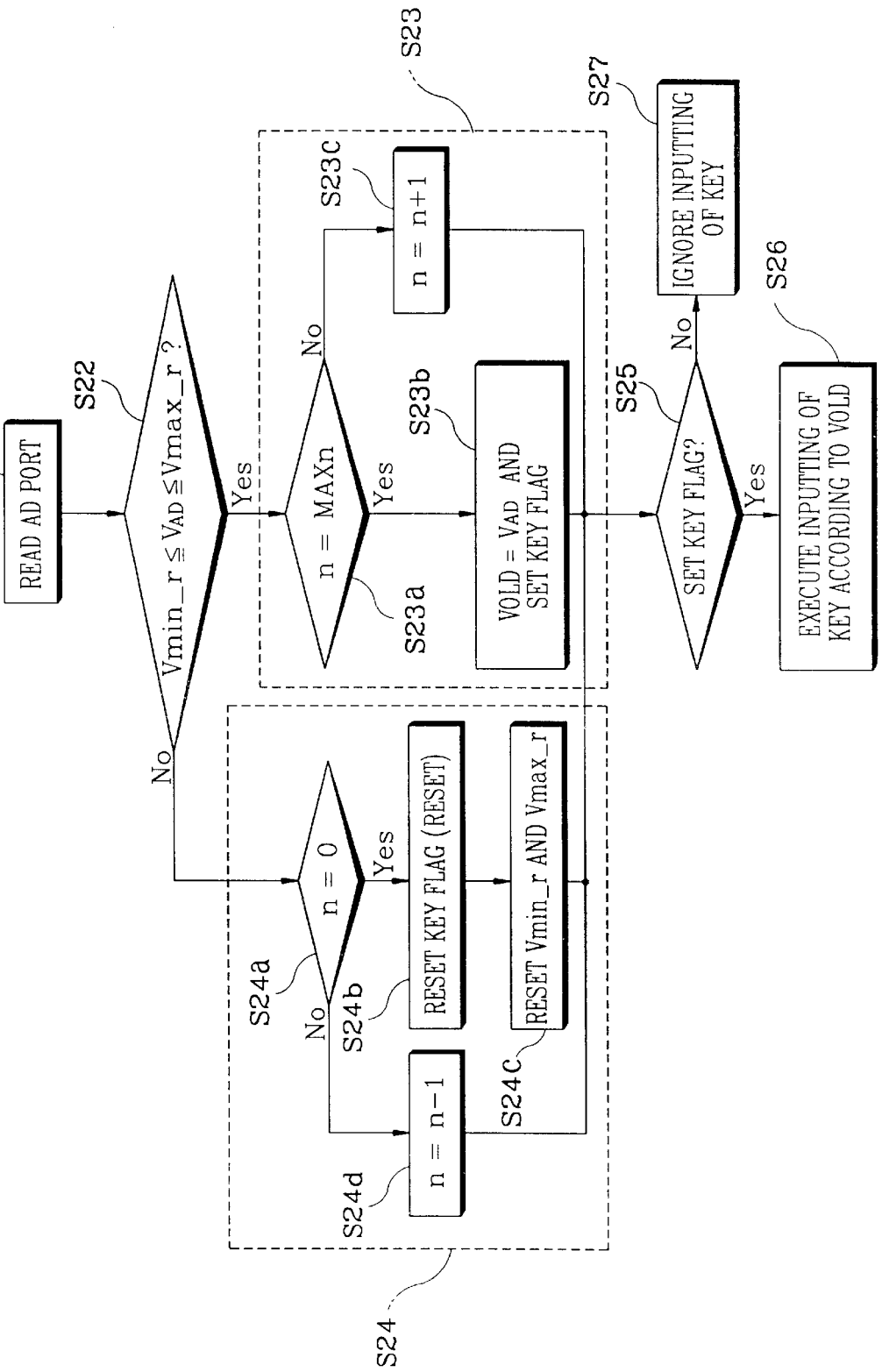
FIG. 3 is a flow diagram showing a method for preventing poor operation of a key according to the present invention.

FIG. 3 is a flow diagram showing a method for preventing poor operation of a key according to the present invention. Referring to FIG. 3, the method for preventing poor operation of a key comprises: a step S21 in which microcomputer 20 detects with its AD port a key input voltage $V_{AD}$ according to a key signal output from control button section 10, a step S22 of determining whether the key input voltage $V_{AD}$ detected in step S21 is within the limits defined by a minimum voltage $V_{min-r}$ and a maximum voltage $V_{max-r}$ required for an effective key operation; a step S23 of setting a key flag when it is determined in step S22 that the key input voltage $V_{AD}$ is within the limits required for effective key operation; a step S24 of resetting the key flag when it is determined in step S22 that the key input voltage $V_{AD}$ is not within the required limits; a step S25 of confirming the key flag set in key flag setting step S23 and the key flag resetting step S24; a step S26 of executing a key input according to a key execution voltage $V_{old}$ when the key flag is set as confirmed in step S25, and a step S27 of ignoring the key input when the key flag is not set as confirmed in step S25.

Key flag setting step S23 comprises: a step S23a of determining whether the noise filtering factor MAXn corresponds to a specific number (n) when it is determined that the key input voltage $V_{AD}$ is within the required limits of step S22; a step S23b of replacing the key input voltage $V_{AD}$ with the key execution voltage $V_{old}$ and setting the key flag when it is determined that noise filtering factor MAXn corresponds to the specific number (n) in step S23a; and a step S23c of increasing the specific number (n) in order to set the next key flag when it is determined that the filtering noise factor MAXn does not correspond to the specific number (n) in step S23a.

Key flag resetting step S24 comprises: a step S24a of determining whether the specific number (n) is "0" when it is determined that the key input voltage $V_{AD}$ is not within the limits required in step S22; a step S24b of resetting the key flag when it is determined that the specific number (n) is "0" in step S24a; a step S24c of resetting the minimum voltage $V_{min-r}$ and maximum voltage $V_{max-r}$ required for effective key operation when the key flag is reset in step S24b; and a step S24d of decreasing the specific number (n) when it is determined that it is not "0" in step S24a.

The operation of the display monitor of the present invention, which prevents poor operation of a key due to chattering noise using the above-described method, is described below with reference to FIGS. 4A and 4B. With this display monitor, video pre-amplifier 50 of FIG. 2 receives the video signal (R,G,B) generated by the computer and amplifies it to a predetermined level. The amplified video signal is sufficiently amplified by video main amplifier 60 so as to be applied to the CRT 70 which scans the sufficiently amplified video signal (R,G,B) according to the cycles of the horizontal sawtooth wave and vertical sawtooth wave current formed in deflection yoke DY, thereby displaying it. The horizontal sawtooth wave current and vertical sawtooth wave current are formed in deflection yoke DY in such a manner that microcomputer 20 receives horizontal and vertical synchronous signals H-SYNC and V-SYNC from the computer to generate the horizontal and vertical oscillation pulses, and sends the horizontal and vertical oscillation pulses to horizontal and vertical deflection circuits 30 and 40, respectively, which process them. The horizontal sawtooth current and vertical sawtooth wave current generated in deflection yoke DY by horizontal and vertical deflection circuits 30 and 40, respectively, determine the horizontal and vertical scanning cycles of the video signal (R,G,B) applied to the CRT 70 and display the video signal according to the scanning cycles.

When a user wants to control an image on the display monitor which operates as described above, he uses control button section 10. That is, the user selects one of tactile switches SW1 to SW5 of control button section 10 to control an image displayed on the CRT. When switch SW1 is a tactile switch for controlling the horizontal position, for example, the user uses it to control the horizontal position of the image displayed on the display monitor. In this case, switch SW1 generates a key signal which is applied to the AD port of microcomputer 20 through resistors R1 to R4 and is detected by microcomputer 20. In other words, microcomputer 20 executes the control program to read key input voltage $V_{AD}$, which is the key signal of switch SW1 selected from tactile switches SW1 to SW5 of control button section 10, in step S21.

Figures 4A, 4B:
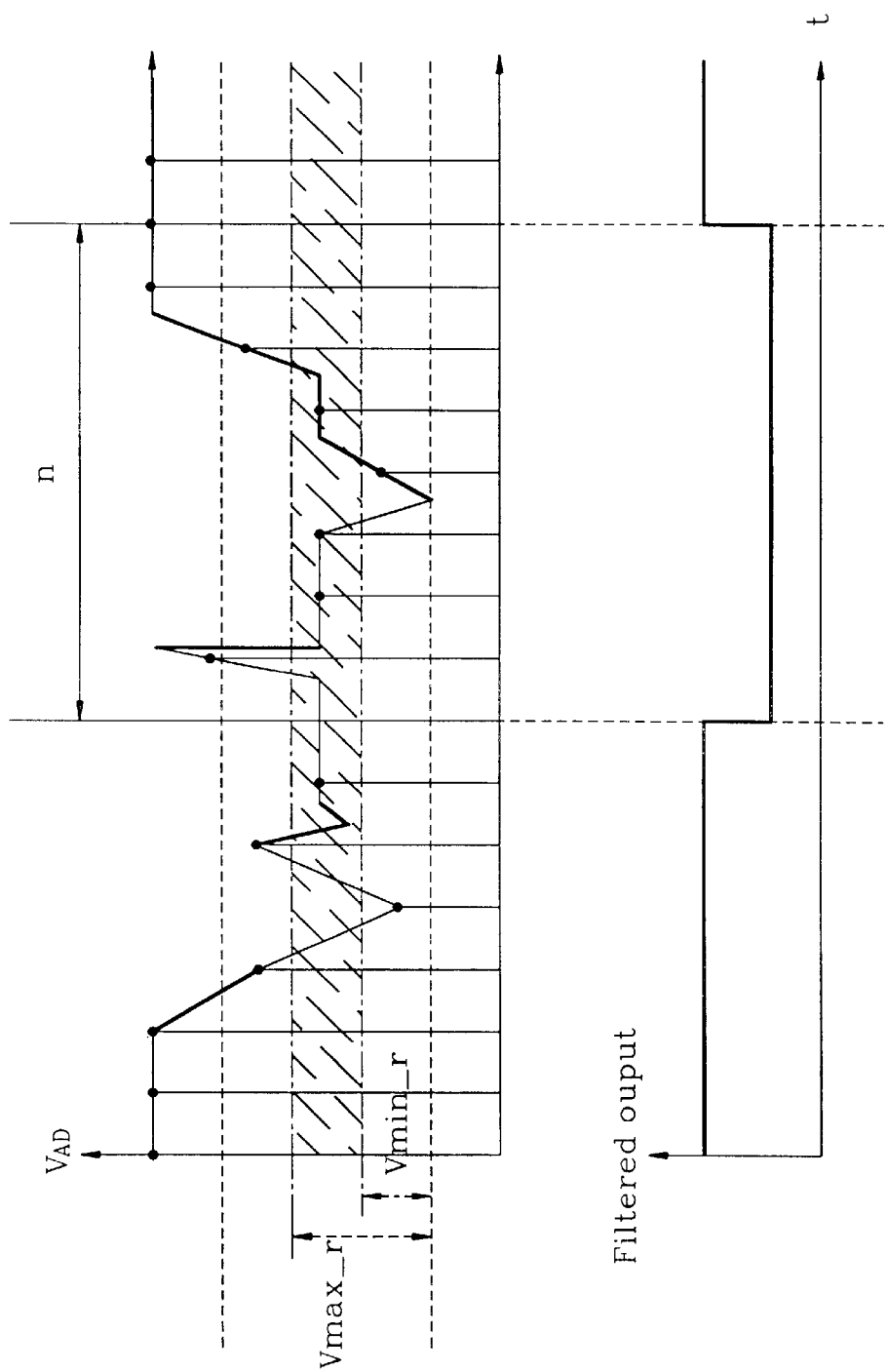
FIGS. 4A and 4B are diagrams showing waveforms of chattering noise generated in a tactile switch and filtered chattering noise, respectively.

In key input voltage $V_{AD}$ range determining step S22, it is determined whether the key input voltage $V_{AD}$ read by microcomputer 20 is within the limits of the minimum voltage $V_{min-r}$ to maximum voltage $V_{max-r}$ required for effective key operation, as shown in FIG. 4A ($V_{min-r} \leq V_{AD} \leq V_{max-r}$). When it is within the limits, it is determined whether a predetermined number (n) of a noise filtering factor corresponds to the number of noise filtering factor (MAXn) in step S23a of key flag setting step S23. That is, it is determined whether the predetermined number (n) of a noise filtering factor in the effective range of the key, as shown in FIG. 4A, corresponds to the number of noise filtering factor (MAXn) showing the number of dots seen in FIG. 4A (n=MAXn). When they correspond to each other, key flag setting step S23b is executed to set the key flag, replacing key input voltage $V_{AD}$ with key execution voltage $V_{old}$ ($V_{old}=V_{AD}$). On the contrary, when they do not correspond to each other, predetermined number (n) of the noise filtering factor increases (n=n+1) to set the key flag in step S23c.

When it is determined that key input voltage $V_{AD}$ is not within the limits of the minimum voltage $V_{min-r}$ and maximum voltage $V_{max-r}$ required for effective key operation in step S22, it is determined whether the predetermined number (n) corresponds to "0" in step S24a of key flag resetting step S24. When the predetermined number (n) corresponds to "0", it is determined that the key signal of the tactile switch selected from control button section 10 of FIG. 3 is not in a normal state. Then, the key flag is reset in step S24b, and step S24c is executed to reset the minimum range $V_{min-r}$ and maximum range $V_{max-r}$ in accordance with effective key operation, thereby resetting the key flag. When the predetermined number (n) is not "0" in step S22, it is decreased (n=n-1) in step S24d so as to set the key flag according to the previous key signal.

When the key flag is set in key flag setting step S23 and key flag resetting step S24, this is confirmed in step S25. When it is confirmed that the key flag is set, the key signal of switch SW1 of the tactile switches of control button section 10 is filtered, as shown in FIG. 4B, and this filtered signal is detected by microcomputer 20 in key input execution step S26. When it is determined that the key flag is not set in step S25, key ignoring step S27 is executed so as to ignore the key signal input through the AD port of microcomputer 20, thereby obtaining the filtered output as shown in FIG. 4B. When microcomputer 20 detects the key signal generated by tactile switch SW1 for controlling the horizontal position, it controls horizontal and vertical deflection circuits 30 and 40, respectively, in order to correct the horizontal position. Under the control of microcomputer 20, horizontal and vertical deflection circuits 30 and 40, respectively, generate a current signal which is corrected and sent to deflection yoke DY, thereby controlling the horizontal position of an image displayed on the CRT 70. As described above, similar to switch SW1, tactile switches SW2 to SW5 operate according to their control functions to prevent poor operation of a key due to chattering noise.

According to the present invention, when the chattering noise is created at the tactile switch of the control button section 10 of the display monitor, the AD port of the microcomputer 20 detects the chattering noise to determine whether a key is operating normally or not. Accordingly, poor operation of the keys due to the chattering noise is prevented.

It will be apparent to those skilled in the art that various modifications and variations can be made in the apparatus and method for preventing poor operation of a key due to chattering noise of the present invention without departing from the spirit or scope of the invention. Thus, it is intended that the present invention cover the modifications and variations of this invention provided they come within the scope of the appended claims and their equivalents.

What is claimed is:

1. An apparatus for preventing poor operation of a key due to chattering noise, comprising:

control button section means for generating a key signal to control a display monitor; and microcomputer means including a control program for preventing poor operation of the key due to chattering noise in the key signal generated by the control button section means;

wherein said microcomputer means detects the key signal when the chattering noise is generated, determines whether the key signal falls within minimum and maximum voltage limits, processes and executes the key signal when the key signal falls within the minimum and maximum voltage limits, and ignores the key signal when the key signal does not fall within the minimum and maximum voltage limits.

2. The apparatus as claimed in claim 1, wherein the microcomputer means includes an AD port for detecting the key signal when the chattering noise is generated in the control button section means.

3. A method for preventing poor operation of a key due to chattering noise, comprising the steps of:

(a) detecting a key input voltage with an AD port of a microcomputer;

(b) determining whether the key input voltage detected in step (a) is within limits defined by a minimum voltage and a maximum voltage required for effective key operation;

(c) setting a key flag when it is determined that the key input voltage is within the limits defined for effective key operation;

(d) resetting the key flag when it if determined that the key input voltage is not within the limits defined for effective key operation;

(e) confirming the key flag settings of steps (c) and (d);

(f) executing a key input according to a key execution voltage when the key flag is set as confirmed in step (e); and (g) ignoring the key input when the key flag is not set as confirmed in step (e), wherein step (c) comprises the steps of:

(a') determining whether a noise filtering factor corresponds to a predetermined number when it is determined that the key input voltage is within the limits defined for effective key operation in step (b);

(b') replacing the key input voltage with the key execution voltage so as to set the key flag when it is determined that the noise filtering factor corresponds to the predetermined number in step (a'); and (c') increasing the predetermined number so as to set the next key flag when it is determined that the noise filtering factor does not correspond to the predetermined number in step (a').

4. The method as claimed in claim 3, wherein step (d) comprises the steps of:

(a") determining whether the predetermined number corresponds to "0" when it is determined that the key input voltage is not within the limits defined for effective key operation in step (b);

(b") resetting the key flag when it is determined that the predetermined number corresponds to "0" in step (a");

(c") resetting the minimum voltage and maximum voltage defined for effective key operation when the key flag is reset in step (b"); and (d") decreasing the predetermined number when it is determined that the predetermined number does not correspond to "0" in step (a").

5. In a display monitor, comprising a control button section for generating a key signal to control the display monitor, and a microcomputer connected to said control button section for receiving key signals so as to generate control outputs for controlling the display monitor;

an apparatus for preventing poor operation of a key due to chattering noise, said apparatus comprising a control program stored in said microcomputer for preventing poor operation of the key due to chattering noise in the key signal generated by said control button section;

wherein said microcomputer executes said control program to detect the key signal when the chattering noise is generated, determines whether the key signal falls within minimum and maximum electrical limits, processes the key signal when the key signal falls within the minimum and maximum electrical limits, and ignores the key signal when the key signal does not fall within the minimum and maximum electrical limits.

6. In the display monitor of claim 5, wherein the microcomputer includes a port for detecting the key signal when the chattering noise is generated in the control button section.

7. In the display monitor of claim 5, wherein said microcomputer detects a key input voltage; and wherein said control program determines whether the key input voltage detected by said microcomputer falls within the electrical limits defined by a minimum voltage and a maximum voltage required for effective key operation.

8. In the display monitor of claim 7, wherein said control program sets a key flag when it is determined that the key input voltage is within the electrical limits required for effective key operation.

9. In the display monitor of claim 8, wherein said control program resets the key flag when it is determined that the key input voltage is not within the electrical limits required for effective key operation.

10. In the display monitor of claim 9, wherein said microcomputer executes a key input operation according to a key execution voltage when the key flag is set by said control program, and wherein said microcomputer ignores the key input when the key flag is reset by said control program.

11. A method for preventing poor operation of a key due to chattering noise, comprising the steps of:

providing a microcomputer having a port for receiving a key input voltage;

detecting the key input voltage;

determining whether the key input voltage detected is within limits defined by a minimum voltage and a maximum voltage required for effective key operation; and executing the key input when the key input voltage detected falls within the limits defined for effective key operation, and ignoring the key input when the key input voltage does not fall within the limits defined for effective key operation.

12. The method of claim 11, wherein a key flag is set in said microcomputer when it is determined that the key input voltage falls within the limits defined for effective key operation, and wherein said key flag is reset within said microcomputer when it is determined that the key input voltage does not fall within the limits defined for effective key operation.

13. The method of claim 12, wherein said key flag is set by determining whether a noise filtering factor corresponds to a predetermined number when it is determined that the key input voltage falls within the limits defined for effective key operation.

14. The method of claim 13, wherein the key input voltage is replaced with a key execution voltage when it is determined that the noise filtering factor corresponds to the predetermined number.

15. The method of claim 14, wherein the predetermined number is increased when it is determined that the noise filtering factor does not correspond to the predetermined number.

16. The method of claim 13, wherein the predetermined number is increased when it is determined that the noise filtering factor does not correspond to the predetermined number.

17. The method of claim 12, wherein the key flag is reset by determining whether a predetermined number corresponds to "0" when it is determined that the key input voltage does not fall within the limits defined for effective key operation.

18. The method of claim 17, wherein the key flag is reset when it is determined that the predetermined number corresponds to "0".

19. The method of claim 18, wherein the minimum voltage and the maximum voltage are reset when the key flag is reset.

20. The method of claim 17, wherein the predetermined number is decreased when it is determined that the predetermined number does not correspond to "0".

* * * * *